United States Patent
Wang et al.

(10) Patent No.: US 9,576,834 B2
(45) Date of Patent: Feb. 21, 2017

(54) STOCKER AND METHOD FOR DISPATCHING WAFER CARRIER IN STOCKER

(71) Applicant: TAIWAN SEMICONDUCTOR MANUFACTURING CO., LTD., Hsinchu (TW)

(72) Inventors: Wei-Cheng Wang, Taoyuan (TW); Feng-Ning Lee, Taoyuan (TW); Bing-Yuan Cheng, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 32 days.

(21) Appl. No.: 14/658,631

(22) Filed: Mar. 16, 2015

(65) Prior Publication Data
US 2016/0276194 A1 Sep. 22, 2016

(51) Int. Cl.
*G06F 7/00* (2006.01)
*H01L 21/677* (2006.01)
*B65G 1/04* (2006.01)

(52) U.S. Cl.
CPC ....... *H01L 21/67766* (2013.01); *B65G 1/0464* (2013.01); *H01L 21/67769* (2013.01)

(58) Field of Classification Search
None
See application file for complete search history.

(56) References Cited

U.S. PATENT DOCUMENTS

2005/0273190 A1* 12/2005 Duffin ................ G05B 19/4189
700/112
2006/0190118 A1* 8/2006 Teferra et al. ..... G05B 19/4189
700/112

FOREIGN PATENT DOCUMENTS

CN 101783308 B 11/2011

* cited by examiner

*Primary Examiner* — Yolanda Cumbess
(74) *Attorney, Agent, or Firm* — Maschoff Brennan

(57) ABSTRACT

A stocker includes a storage shelf, an output-relay shelf, a first crane, an output shelf, a second crane, and a controller. The storage shelf has a plurality of storage spaces. The output-relay shelf has a plurality of first output-relay spaces. The output shelf has an output space. The controller is configured to drive the first crane to preferentially transfer a first wafer carrier stored in one of the storage spaces to an empty one of the first output-relay spaces according to a delivery command defining a high priority of the first wafer carrier, and configured to drive the second crane to preferentially transfer the first wafer carrier from the first output-relay space storing the first wafer carrier to the output space according to the delivery command if the output space is empty.

20 Claims, 8 Drawing Sheets

STOCKER AND METHOD FOR DISPATCHING WAFER CARRIER IN STOCKER

BACKGROUND

The manufacture of semiconductor devices involves the performance of a series of process steps using a variety of high tech production and metrology tools in a certain order and often within a certain period of time. The primary function of a wafer logistics system in a semiconductor fabrication facility, or "fab," is to deliver the wafers to each of the tools at the right time, as well as to track the location and status of the wafers throughout the process.

Automated material handling systems (AMHS) are used in fabs to carry out the automated functions more efficiently, consistently, and safely than can be done via manual means. Process and tool changes have placed additional demands on the AMHS. Such demands include the necessity for cross-floor and cross-phase transportation and increased transportation volume, the combination of which often results in traffic jams, delays, and lower tool utilization.

When a wafer carrier, such as a standard mechanical interface (SMIF) pod or front opening unified pod (FOUP) containing wafers, is to be transferred, a manufacturing execution system (MES) determines to what destination in the fab the wafer carrier should be transferred. In an AMHS, stockers are widely used in conjunction with automatically guided or overhead transport vehicles, either on the ground or suspended on tracks, for the storing and transporting of semiconductor wafers in SMIF pods or in FOUPs. Once the destination decision has been made, the MES sends a transfer request to a material control system (MCS), which calculates a detailed transportation route using a real time dispatching (RTD) system and then notifies a transfer manager to execute the transfer step-by-step. AMHS's have been used extensively in the semiconductor fabrication field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
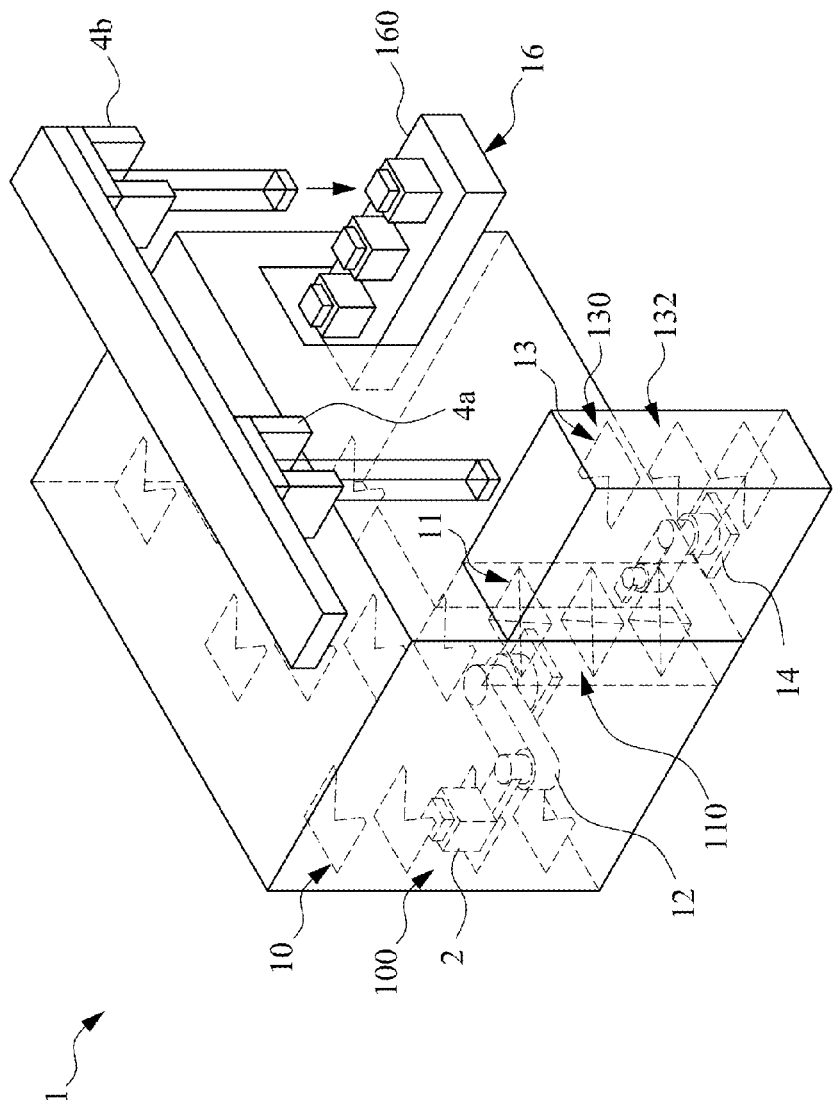
FIG. 1 is a perspective view of a stocker according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

In order to fully utilize cranes of front opening unified pod (FOUP) storage solution in a stocker, the input/output ports of the stocker need sufficient buffers to optimize the performance of OHT (Overhead Hoist Transfer)/OHS (OverHead Shuttle) vehicles and the cranes. The side effects are high cost owing to long conveyor, and long waiting time for priority wafer carriers (i.e., FOUPs having high delivery/storage priority) to be served by OHT/OHS vehicle while outputting or by the cranes while inputting.

To improve FOUP/Reticle pod storage solution (e.g., a stocker, a tower stocker, or a vertical carousel) for 300 mm or 450 mm fab to be more productivity and more efficient, the disclosure provides a stocker that OHT/OHS vehicle can access to and methods for dispatching a wafer carrier in a stocker to provide more buffers, so as to allow priority wafer carriers to be served. Therefore, the stocker of the disclosure can have a small footprint to provide I/O ports with more buffers, so as to improve the performance of both the stocker and the OHT/OHS vehicle. Furthermore, the stocker of the disclosure allows priority wafer carriers to be served firstly without the "First-in-first-out" constraint like original I/O port designs. With better OHT/OHS vehicle and cranes performance, the stocker of the disclosure can be designed with more capacity to reduce storage cost.

Figure 2:
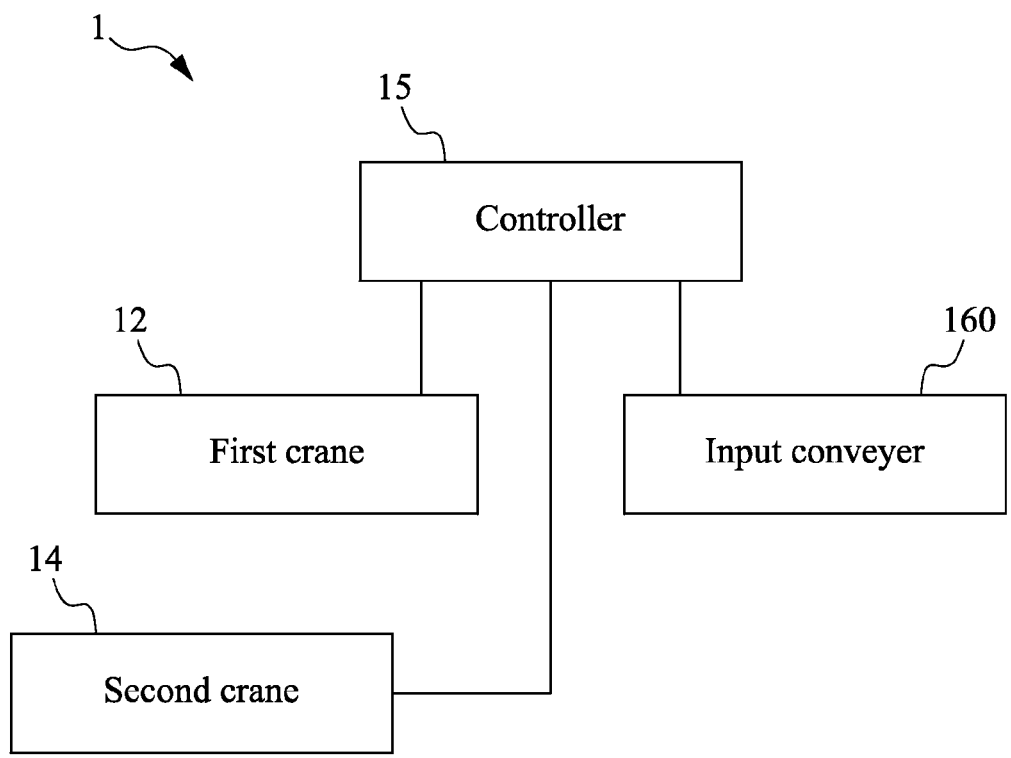
FIG. 2 is a schematic diagram of the stocker in FIG. 1.

FIG. 1 is a perspective view of a stocker 1 according to an embodiment of the present disclosure. FIG. 2 is a schematic diagram of the stocker 1 in FIG. 1.

As shown in FIG. 1 and FIG. 2, the stocker 1 includes a storage shelf 10, an output-relay shelf 11, a first crane 12, an output shelf 13, a second crane 14, and a controller 15. The storage shelf 10 has a plurality of storage spaces 100 separately arranged along a vertical direction. The output-relay shelf 11 has a plurality of first output-relay spaces 110 separately arranged along the vertical direction. The output shelf 13 has an output space 130 right under an output OHT vehicle 4a and a plurality of second output-relay spaces 132 separately arranged under the output space 130 along the vertical direction, in which the output-relay shelf 11, the output shelf 13, and the second crane 14 can be deemed as an output port of the stocker 1. The first crane 12 is substantially located between the storage shelf 10 and the output-relay shelf 11, and the second crane 14 is substantially located between the output-relay shelf 11 and the output shelf 13.

The controller 15 of the stocker 1 is configured to drive the first crane 12 to transfer a wafer carrier 2 stored in one of the storage spaces 100 to an empty one of the first output-relay spaces 110 according to a delivery command defining a high delivery priority of the wafer carrier 2 (i.e., the priority of delivering the wafer carrier 2 is high), and configured to drive the second crane 14 to transfer the wafer carrier 2 from the first output-relay space 110 storing the wafer carrier 2 to the output space 130 according to the delivery command if the output space 130 is empty. Moreover, the controller 15 is further configured to drive the second crane 14 to temporarily transfer the wafer carrier 2 from the first output-relay space 110 storing the wafer carrier 2 to an empty one of the second output-relay spaces 132 according to the delivery command if the output space 130 is not empty. On the other hand, if no delivery command defining a high delivery priority of any wafer carrier in the stocker 1 is received, the controller 15 is configured to drive the first crane 12 and the second crane 14 to normally transfer the wafer carriers from the storage space 100 to the output space 130.

In some embodiments, when the output space 130 is empty after the wafer carrier 2 is transferred to the empty second output-relay space 132, the controller 15 is further configured to drive the second crane 14 to transfer the first wafer carrier 2 from the second output-relay space 132 storing the first wafer carrier 2 to the output space 130 according to the delivery command.

In addition, the stocker 1 of the embodiment further includes an input port 16 including an input conveyor 160. The input conveyer 160 can transfer wafer carriers loaded by an input OHT vehicle 4b into the stocker 1, and the controller 15 is further configured to transfer wafer carriers to empty storage spaces 100 sequentially.

Because the storage spaces 100 are separately arranged along the vertical direction, the first output-relay spaces 110 are separately arranged along the vertical direction, and the output space 130 and the second output-relay spaces 132 are separately arranged along the vertical direction, the stocker 1 of the embodiment can have a small footprint to provide the output port with more buffers.

However, the disclosure is not limited in this regard. In some embodiments, to enlarge the capacity and obtain more buffers, the stocker 1 includes a plurality of storage shelves 10 separately arranged along a horizontal direction, a plurality of output-relay shelves 11 separately arranged along the horizontal direction, and a plurality of output shelves 13 separately arranged along the horizontal direction.

Figure 3:
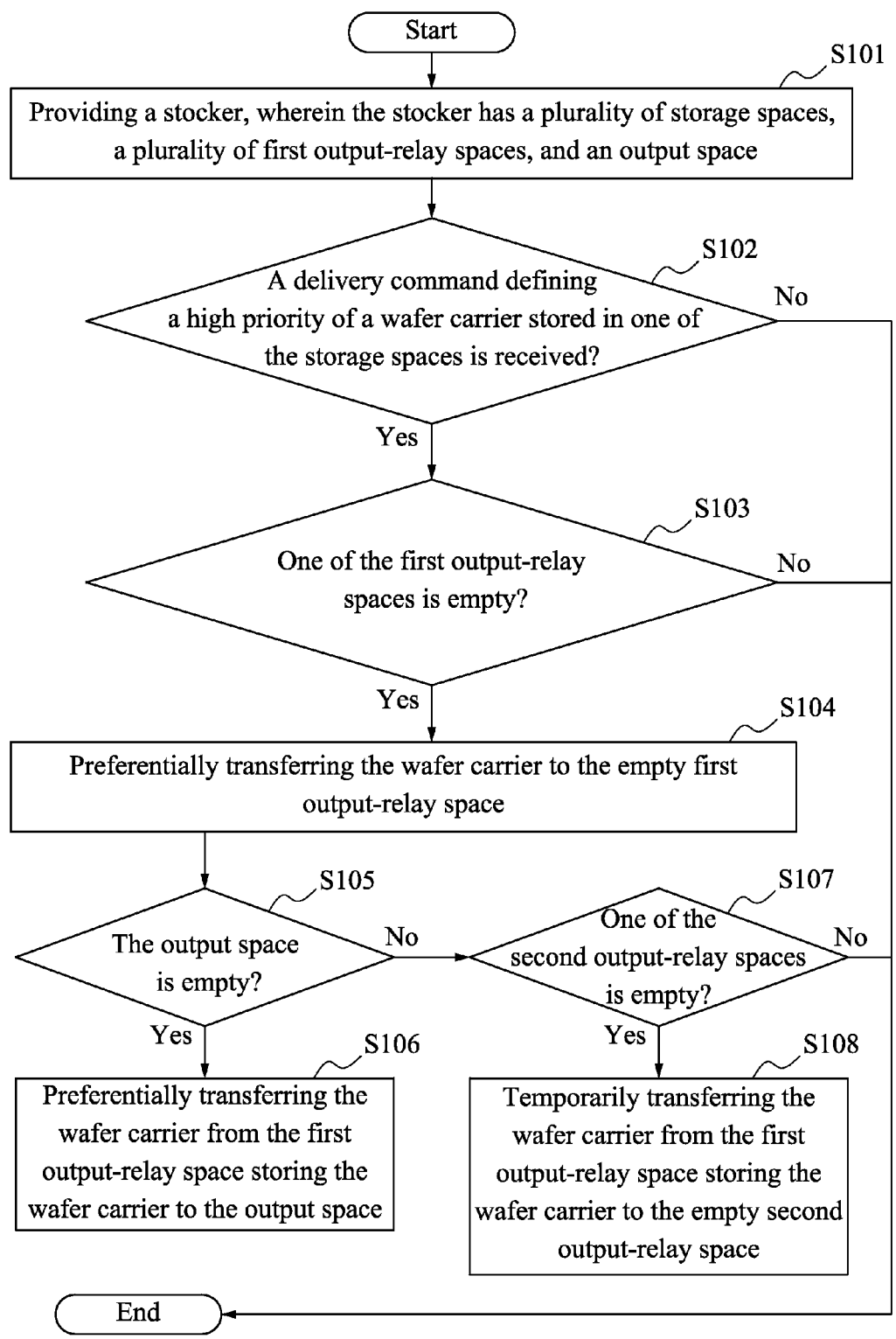
FIG. 3 is a method for dispatching a wafer carrier in a stocker an embodiment of the present disclosure.

FIG. 3 is a method for dispatching a wafer carrier in a stocker an embodiment of the present disclosure. As shown in FIG. 3, with reference to FIG. 1 and FIG. 2, the method for dispatching a wafer carrier in a stocker at least includes steps S101-S108 shown below. It is noted that steps S101-S108 can be performed to output a wafer carrier 2 out of the stocker 1.

In step S101, a stocker 1 is provided, in which the stocker 1 has a plurality of storage spaces 100, a plurality of first output-relay spaces 110, and an output space 130. Thereafter in step S102, whether a delivery command defining a high delivery priority of a wafer carrier 2 stored in one of the storage spaces 100 is received is determined. Thereafter in step S103, if the delivery command is received (i.e., the determination of step S102 is YES), whether one of the first output-relay spaces 110 is empty is determined. Thereafter in step S104, if one of the first output-relay spaces 110 is empty (i.e., the determination of step S103 is YES), the wafer carrier 2 is transferred to the empty first output-relay space 110.

Therefore, according to steps S101-S104, when the controller 15 receive the delivery command and there exists an empty first output-relay space 110, the controller 15 can drive the first crane 12 to transfer the wafer carrier 2 to the empty first output-relay space 110. Because the first output-relay spaces 110 are separately arranged, the wafer carrier 2 can be transferred to any empty first output-relay space 110 without the "First-in-first-out" constraint like original I/O port designs, so that the first output-relay spaces 110 of the stocker 1 of the embodiment can provide more buffers to allow priority wafer carriers to be served.

In step S105, whether the output space 130 is empty is determined. Thereafter in step S106, if the output space 130 is empty (i.e., the determination of step S105 is YES), the wafer carrier 2 is transferred from the first output-relay space 110 storing the wafer carrier 2 to the output space 130. Thereafter in step S107, if the output space 130 is not empty (i.e., the determination of step S106 is NO), whether one of the second output-relay spaces 132 is empty is determined. Thereafter in step S108, if one of the second output-relay spaces 132 is empty (i.e., the determination of step S107 is YES), the wafer carrier 2 is temporarily transferred from the first output-relay space 110 storing the wafer carrier 2 to the empty second output-relay space 132.

Therefore, according to steps S105-S106, if the output space 130 is empty after the wafer carrier 2 is transferred to the empty first output-relay space 110, the controller 15 can drive the second crane 14 to transfer the wafer carrier 2 to the output space 130, and then the output OHT vehicle 4a can transfer the wafer carrier 2 having the high delivery priority away from the output space 130. On the other hand, according to steps S107-S108, if the output space 130 is not empty and there exists an empty second output-relay space 132 after the wafer carrier 2 is transferred to the empty first output-relay space 110, the controller 15 will drive the second crane 14 to temporarily transfer the wafer carrier 2 to an empty second output-relay space 132. Because the second output-relay spaces 132 are separately arranged, the wafer carrier 2 can be transferred to any empty second output-relay space 132 without the "First-in-first-out" constraint like original I/O port designs, so that the second output-relay spaces 132 of the stocker 1 of the present disclosure can also provide more buffers to allow priority wafer carriers to be served. Moreover, by temporarily transfer the wafer carrier 2 to an empty second output-relay space 132 when the output space 130 is not empty, there will be more empty first output-relay spaces 110 available for other wafer carriers to be transferred from the storage spaces 100 by the first crane 12.

According to the foregoing embodiment, it can be seen that the method is event based, but the disclosure is not limited in this regard. In practical applications, the method of the disclosure can be timing based. For example, the method can further include following steps alternatively.

In some embodiments, the method can further include step S109. In step S109, if all of the second output-relay spaces 132 are not empty (i.e., the determination of step S107 is NO), whether one of the second output-relay spaces 132 is empty is determined again after a predetermined time interval.

In some embodiments, the method can further include step S110-S111. In step S110, after the wafer carrier 2 is transferred to the empty second output-relay space 132, whether the output space 130 is empty is determined again after a predetermined time interval. Thereafter in step S111, if the output space 130 is empty after the wafer carrier 2 is transferred to the empty second output-relay space 132 (i.e., the determination of step S110 is YES), the wafer carrier 2 is transferred from the second output-relay space 132 storing the wafer carrier 2 to the output space 130.

In some embodiments, the method can further include step S112. In step S112, if the output space 130 is not empty after the wafer carrier 2 is transferred to the empty second output-relay space 132 (i.e., the determination of step S110 is NO), whether the output space 130 is empty is determined again after a predetermined time interval.

In some embodiments, the method can further include step S113. In step S113, if the delivery command is not received (i.e., the determination of step S102 is NO), whether the delivery command is received is determined again after a predetermined time interval.

In some embodiments, the method can further include step S114. In step S114, if all of the first output-relay spaces 110 are not empty (i.e., the determination of step S103 is NO), whether one of the first output-relay spaces 110 is empty is determined again after a predetermined time interval.

In some embodiments, the predetermined time interval is one second, but the disclosure is not limited in this regard.

Figure 4:
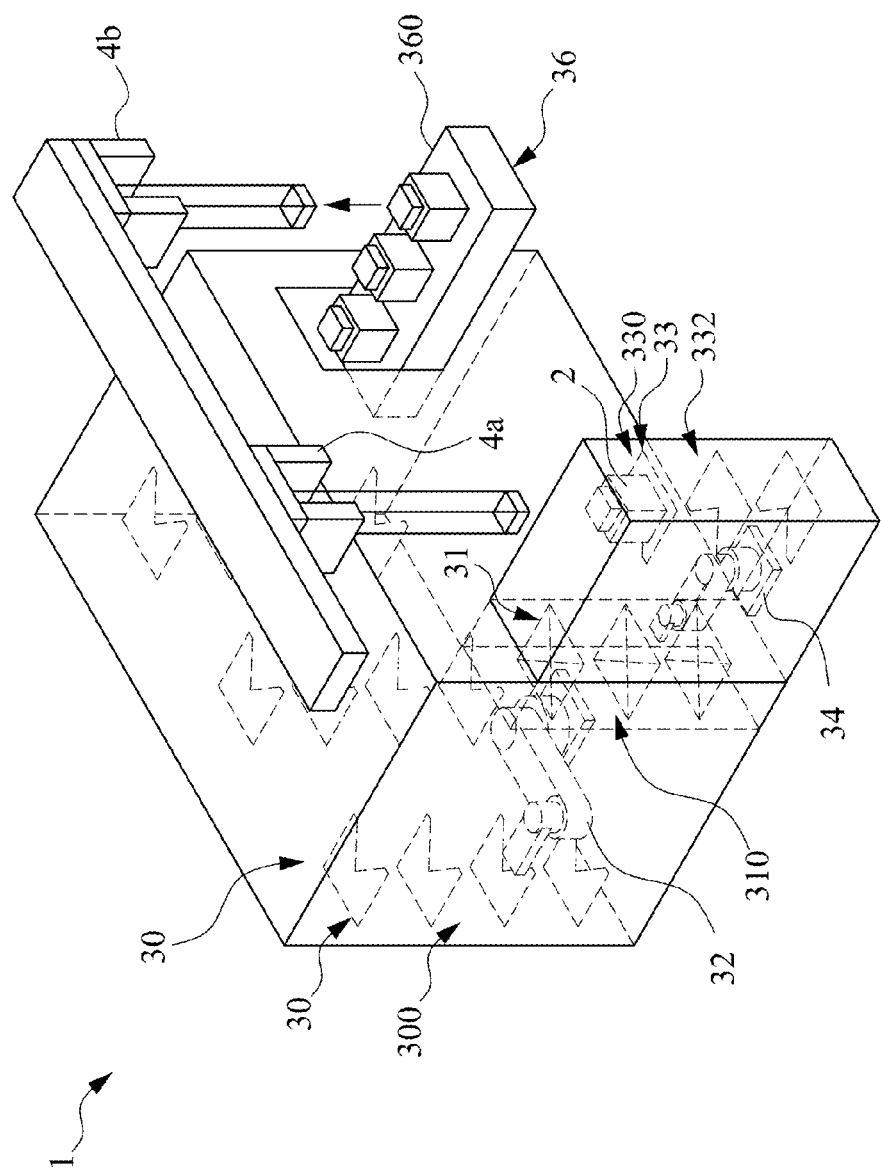
FIG. 4 is a perspective view of a stocker according to another embodiment of the present disclosure.
Figure 5:
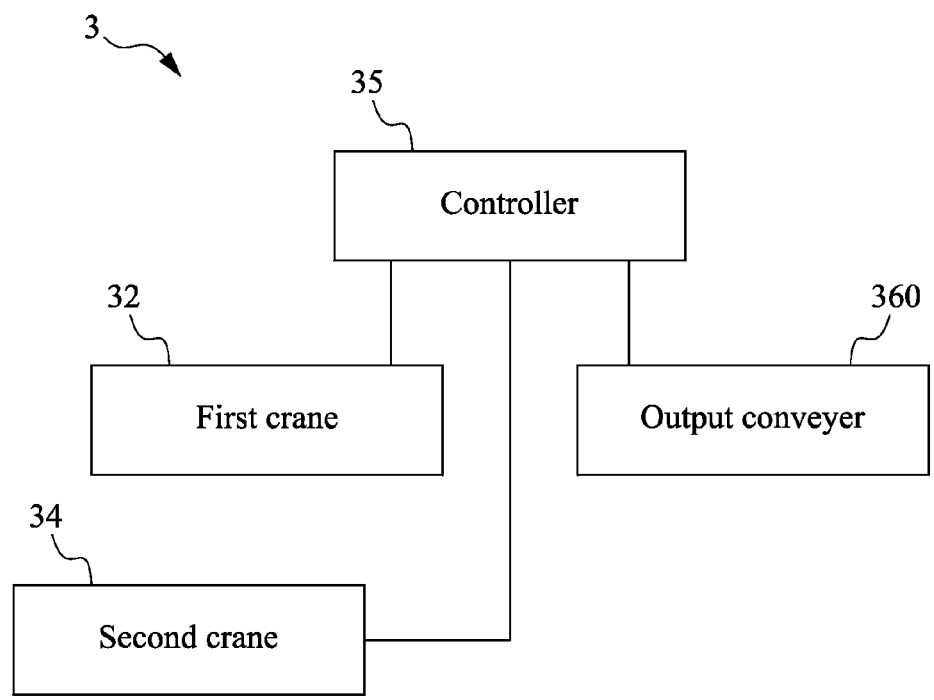
FIG. 5 is a schematic diagram of the stocker in FIG. 4.

FIG. 4 is a perspective view of a stocker 3 according to another embodiment of the present disclosure. FIG. 5 is a schematic diagram of the stocker 3 in FIG. 4.

As shown in FIG. 4 and FIG. 5, the stocker 3 includes a storage shelf 30, an input-relay shelf 31, a first crane 32, an input shelf 33, a second crane 34, and a controller 35. The storage shelf 30 has a plurality of storage spaces 300 separately arranged along a vertical direction. The input-relay shelf 31 has a plurality of first input-relay spaces 310 separately arranged along the vertical direction. The input shelf 33 has an input space 330 right under an input OHT vehicle 4b and a plurality of second input-relay spaces 332 separately arranged under the input space 330 along the vertical direction, in which the input-relay shelf 31, the second crane 34, and the input shelf 33 can be deemed as the input port of the stocker 3. The first crane 32 is substantially located between the storage shelf 30 and the input-relay shelf 31, and the second crane 34 is substantially located between the input-relay shelf 31 and the input shelf 33.

The controller 35 of the stocker 3 is configured to drive the second crane 34 to transfer a wafer carrier 2 stored in the input space 330 to an empty one of the first input-relay spaces 310 according to a storage command defining a high storage priority of the wafer carrier 2 (i.e., the priority of storing the wafer carrier 2 is high), and configured to drive the first crane 32 to transfer the wafer carrier 2 from the first input-relay space 310 storing the wafer carrier 2 to an empty one of the storage spaces 300 according to the storage command. Moreover, the controller 35 is further configured to drive the second crane 34 to temporarily transfer the wafer carrier 2 from the input space 330 to an empty one of the second input-relay spaces 332 according to the storage command if all of the first input-relay spaces 310 are not empty. On the other hand, if no storage command defining a high storage priority of any wafer carrier in the stocker 3 is received, the controller 35 is configured to drive the first crane 32 and the second crane 34 to normally transfer the wafer carriers from the input space 330 to the storage spaces 300.

In some embodiments, when one of the first input-relay spaces 310 is empty after the wafer carrier 2 is transferred to the empty second input-relay space 332, the controller 35 is further configured to drive the second crane 34 to transfer the wafer carrier 2 from the second input-relay space 332 storing the wafer carrier 2 to the empty first input-relay space 310 according to the storage command.

In addition, the stocker 3 of the embodiment further includes an output port 36 including an output conveyor 360. The controller 35 is further configured to transfer wafer carriers to the output conveyer 360 from the storage spaces 300 sequentially, and the output conveyer 360 can then transfer wafer carriers out of the stocker 3 to be unloaded by an output OHT vehicle 4a.

Because the storage spaces 300 are separately arranged along the vertical direction, the first input-relay spaces 310 are separately arranged along the vertical direction, and the input space 330 and the second input-relay spaces 332 are separately arranged along the vertical direction, the stocker 3 of the embodiment can have a small footprint to provide the input port with more buffers.

However, the disclosure is not limited in this regard. In some embodiments, to enlarge the capacity and obtain more buffers, the stocker 3 includes a plurality of storage shelves 30 separately arranged along a horizontal direction, a plurality of input-relay shelves 31 separately arranged along the horizontal direction, and a plurality of input shelves separately arranged along the horizontal direction.

Figure 6:
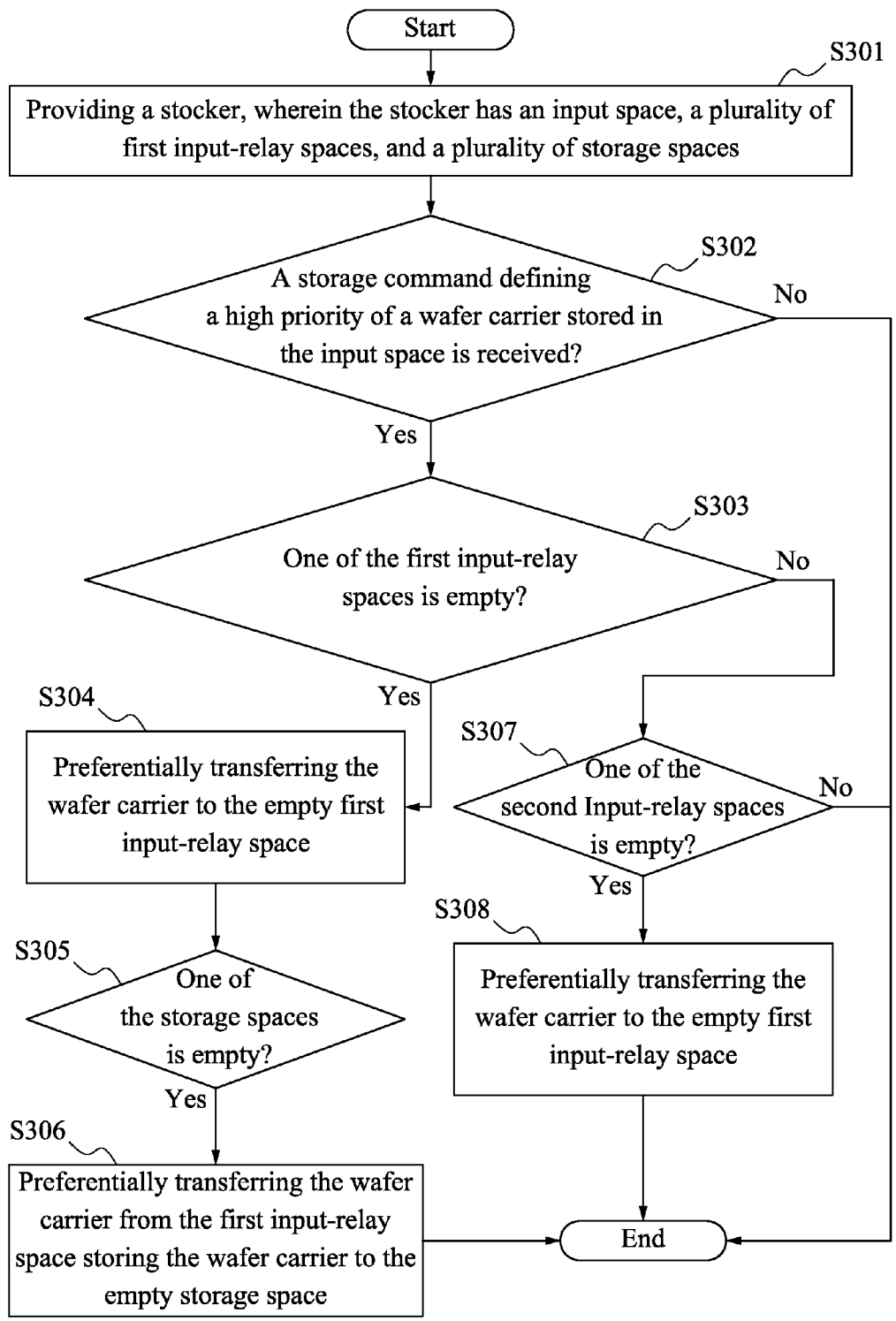
FIG. 6 is a method for dispatching a wafer carrier in a stocker another embodiment of the present disclosure.

FIG. 6 is a method for dispatching a wafer carrier in a stocker another embodiment of the present disclosure. As shown in FIG. 6, with reference to FIG. 4 and FIG. 5, the method for dispatching a wafer carrier in a stocker at least includes steps S301-S308 shown below. It is noted that steps S301-S308 can be performed to input a wafer carrier 2 into the stocker 3.

In step S301, a stocker 3 is provided, in which the stocker 3 has an input space 330, a plurality of first input-relay spaces 310, and a plurality of storage spaces 300. Thereafter in step S302, whether a storage command defining a high storage priority of a wafer carrier 2 stored in the input space 330 is received is determined. Thereafter in step S303, if the storage command is received (i.e., the determination of step S302 is YES), whether one of the first input-relay spaces 310 is empty is determined. Thereafter in step S304, if one of the first input-relay spaces 310 is empty (i.e., the determination of step S303 is YES), the wafer carrier 2 is transferred to the empty first input-relay space 310.

Therefore, according to steps S301-S304, when the controller 35 receive the storage command and there exists an empty first input-relay space 310, the controller 35 can drive the second crane 34 to transfer the wafer carrier 2 to the empty first input-relay space 310. Because the first input-relay spaces 310 are separately arranged, the wafer carrier 2 can be transferred to any empty first input-relay space 310 without the "First-in-first-out" constraint like original I/O port designs, so that the first input-relay spaces 310 of the stocker 3 of the embodiment can provide more buffers to allow priority wafer carriers to be served.

In step S305, whether one of the storage spaces 300 is empty is determined. Thereafter in step S306, if one of the storage spaces 300 is empty (i.e., the determination of step S305 is YES), the wafer carrier 2 is transferred from the first input-relay space 310 storing the wafer carrier 2 to the empty storage space 300. Thereafter in step S307, if all of the first input-relay spaces 310 are not empty (i.e., the determination of step S303 is NO), whether one of the second input-relay spaces 332 is empty is determined. Thereafter in step S308, if one of the second input-relay spaces 332 is empty (i.e., the determination of step S307 is YES), the wafer carrier 2 is temporarily transferred from the input space 330 storing the wafer carrier 2 to the empty second input-relay space 332.

Therefore, according to steps S305-S306, if one of the storage spaces 300 is empty after the wafer carrier 2 is transferred to the empty first input-relay space 310, the controller 35 can drive the first crane 32 to transfer the wafer carrier 2 to the empty storage space 300. On the other hand, according to steps S307-S308, if all of the first input-relay spaces 310 are not empty and there exists an empty second input-relay space 332, the controller 35 will drive the second crane 34 to temporarily transfer the wafer carrier 2 to an empty second input-relay space 332 from the input space 330. Because the second input-relay spaces 332 are separately arranged, the wafer carrier 2 can be transferred to any empty second input-relay space 332 without the "First-in-first-out" constraint like original I/O port designs, so that the second input-relay spaces 332 of the stocker 3 of the present disclosure can also provide more buffers to allow priority wafer carriers to be served. Moreover, by temporarily transfer the wafer carrier 2 to an empty second input-relay space 332 when all of the first input-relay spaces 310 are not empty, the input space 330 will be available for other carrier to be loaded by the input OHT vehicle 4b.

According to the foregoing embodiment, it can be seen that the method is event based, but the disclosure is not limited in this regard. In practical applications, the method of the disclosure can be timing based. For example, the method can further include following steps alternatively.

In some embodiments, the method can further include step S309. In step S309, if all of the second input-relay spaces 332 are not empty (i.e., the determination of step S307 is NO), whether one of the second input-relay spaces 332 is empty is determined again after a predetermined time interval.

In some embodiments, the method can further include step S310-S311. In step S310, after the wafer carrier 2 is transferred to the empty second input-relay space 332, whether one of the first input-relay spaces 310 is empty is determined again after a predetermined time interval. Thereafter in step S311, if one of the first input-relay spaces 310 is empty after the wafer carrier 2 is transferred to the empty second input-relay space 332 (i.e., the determination of step S310 is YES), the wafer carrier 2 is transferred from the second input-relay space 332 storing the wafer carrier 2 to the empty first input-relay space 310.

In some embodiments, the method can further include step S312. In step S312, if all of the first input-relay spaces 310 are not empty after the wafer carrier 2 is transferred to the empty second input-relay space 332 (i.e., the determination of step S310 is NO), whether one of the first input-relay spaces 310 is empty is determined again after a predetermined time interval.

In some embodiments, the method can further include step S313. In step S313, if the storage command is not received (i.e., the determination of step S302 is NO), whether the storage command is received is determined again after a predetermined time interval.

In some embodiments, the method can further include step S314. In step S314, if all of the storage spaces 300 are not empty (i.e., the determination of step S305 is NO), whether one of the storage spaces 300 is empty is determined again after a predetermined time interval.

In some embodiments, the predetermined time interval is one second, but the disclosure is not limited in this regard.

Figure 7:
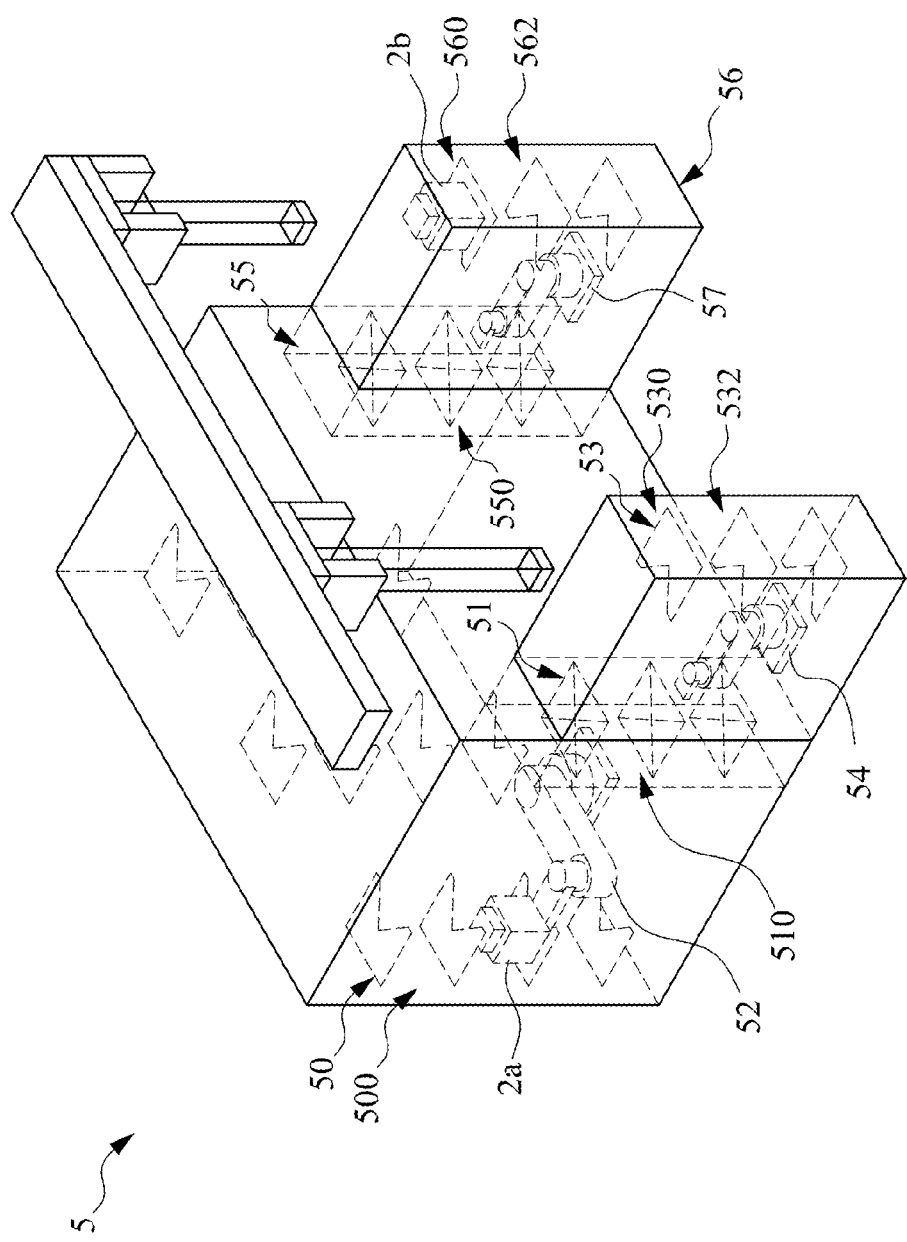
FIG. 7 is a perspective view of a stocker according to yet another embodiment of the present disclosure.
Figure 8:
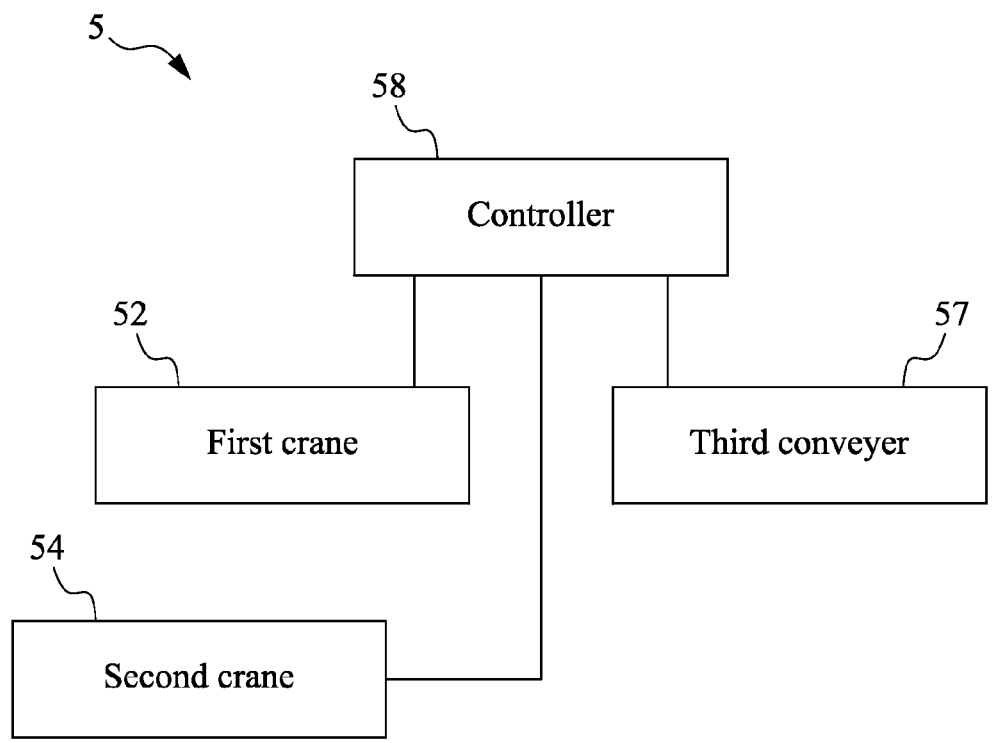
FIG. 8 is a schematic diagram of the stocker in FIG. 7.

FIG. 7 is a perspective view of a stocker 5 according to yet another embodiment of the present disclosure. FIG. 8 is a schematic diagram of the stocker 5 in FIG. 7.

As shown in FIG. 7 and FIG. 8, the stocker 5 includes a storage shelf 50, an output-relay shelf 51, a first crane 52, an output shelf 53, a second crane 54, a controller 58, an input-relay shelf 55, an input shelf 56, and a third crane 57. The storage shelf 50 has a plurality of storage spaces 500 separately arranged along a vertical direction. The output-relay shelf 51 has a plurality of first output-relay spaces 510 separately arranged along the vertical direction. The output shelf 53 has an output space 530 right under an output OHT vehicle 4a and a plurality of second output-relay spaces 532 separately arranged under the output space 530 along the vertical direction, in which the output-relay shelf 51, the output shelf 53, and the second crane 54 can be deemed as an output port of the stocker 5. The first crane 52 is substantially located between the storage shelf 50 and the output-relay shelf 51, and the second crane 54 is substantially located between the output-relay shelf 51 and the output shelf 53.

The controller 58 of the stocker 5 is configured to drive the first crane 52 to transfer a first wafer carrier stored in one of the storage spaces 500 to an empty one of the first output-relay spaces 510 according to a delivery command defining a high delivery priority of the first wafer carrier 2a, and configured to drive the second crane 54 to transfer the first wafer carrier 2a from the first output-relay space 510 storing the first wafer carrier 2a to the output space 530 according to the delivery command if the output space 530 is empty. The controller 58 is further configured to drive the second crane 54 to temporarily transfer the first wafer carrier 2a from the first output-relay space 510 storing the first wafer carrier 2a to an empty one of the second output-relay spaces 532 according to the delivery command if the output space 530 is not empty. When the output space 530 is empty after the first wafer carrier 2a is transferred to the empty second output-relay space 532, the controller 58 is further configured to drive the second crane 54 to transfer the first wafer carrier 2a from the second output-relay space 532 storing the first wafer carrier 2a to the output space 530 according to the delivery command. On the other hand, if no delivery command defining a high delivery priority of any wafer carrier in the stocker 5 is received, the controller 58 is configured to drive the first crane 52 and the second crane 54 to normally transfer the wafer carriers from the storage spaces 500 to the output space 530.

In addition, the input-relay shelf 55 has a plurality of first input-relay spaces 550 separately arranged along the vertical direction. The input shelf 56 has an input space 560 right under an input OHT vehicle 4b and a plurality of second input-relay spaces 562 separately arranged under the input space 560 along the vertical direction, in which the input-relay shelf 55, the third crane 57, and the input shelf 56 can be deemed as the input port of the stocker 5. The first crane 52 is substantially located between the storage shelf 50 and the input-relay shelf 55, and the third crane 57 is substantially located between the input-relay shelf 55 and the input shelf 56.

The controller 58 of the stocker 5 is further configured to drive the third crane 57 to transfer a second wafer carrier 2b stored in the input space 560 to an empty one of the first input-relay spaces 550 according to a storage command defining a high storage priority of the second wafer carrier 2b, and configured to drive the first crane 52 to transfer the second wafer carrier 2b from the first input-relay space 550 storing the second wafer carrier 2b to an empty one of the storage spaces 500 according to the storage command. The controller 58 is further configured to drive the third crane 57 to temporarily transfer the second wafer carrier 2b from the input space 560 to an empty one of the second input-relay spaces 562 according to the storage command if all of the first input-relay spaces 550 are not empty. When one of the first input-relay spaces 550 is empty after the second wafer carrier 2b is transferred to the empty second input-relay space 562, the controller 58 is further configured to drive the third crane 57 to transfer the second wafer carrier 2b from the second input-relay space 562 storing the second wafer carrier 2b to the empty first input-relay space 550 according to the storage command. On the other hand, if no storage command defining a high storage priority of any wafer carrier in the stocker 5 is received, the controller 58 is configured to drive the first crane 52 and the third crane 57 to normally transfer the wafer carriers from the input space 560 to the storage spaces 500.

Because the storage spaces 500 are separately arranged along the vertical direction, the first output-relay spaces 510 are separately arranged along the vertical direction, the output space 530 and the second output-relay spaces 532 are separately arranged along the vertical direction, first input-relay spaces 550 are separately arranged along the vertical direction, and the input space 560 the second input-relay spaces 562 are separately arranged along the vertical direction, the stocker 5 of the embodiment can have a small footprint to provide the I/O ports with more buffers.

However, the disclosure is not limited in this regard. In some embodiments, to enlarge the capacity and obtain more buffers, the stocker 1 includes a plurality of storage shelves 50 separately arranged along a horizontal direction, a plurality of output-relay shelves 51 separately arranged along the horizontal direction, a plurality of output shelves 53 separately arranged along the horizontal direction, a plurality of input-relay shelves 55 separately arranged along the horizontal direction, and a plurality of input shelves separately arranged along the horizontal direction.

According to the foregoing recitations of the embodiments of the disclosure, it can be seen that the disclosure provides a stocker that OHT/OHS vehicle can access to and methods for dispatching a wafer carrier in a stocker to provide more buffers, so as to allow priority wafer carriers to be served. Therefore, the stocker of the disclosure can have a small footprint to provide I/O ports with more buffers, so as to improve the performance of both the stocker and the OHT/OHS vehicle. Furthermore, the stocker of the disclosure allows priority wafer carriers to be served firstly without the "First-in-first-out" constraint like original I/O port designs. With better OHT/OHS vehicle and cranes performance, the stocker of the disclosure can be designed with more capacity to reduce storage cost.

According to some embodiments, a stocker includes a storage shelf, an output-relay shelf, a first crane, an output shelf, a second crane, and a controller. The storage shelf has a plurality of storage spaces. The output-relay shelf has a plurality of first output-relay spaces. The output shelf has an output space. The controller is configured to drive the first crane to transfer a first wafer carrier stored in one of the storage spaces to an empty one of the first output-relay spaces according to a delivery command defining a high priority of the first wafer carrier, and configured to drive the second crane to transfer the first wafer carrier from the first output-relay space storing the first wafer carrier to the output space according to the delivery command if the output space is empty.

According to some embodiments, a method for dispatching a wafer carrier. The method includes: providing a stocker, wherein the stocker has a plurality of storage spaces, a plurality of first output-relay spaces, and an output space; determining whether a delivery command defining a high priority of a wafer carrier stored in one of the storage spaces is received; if the delivery command is received, determining whether one of the first output-relay spaces is empty; if one of the first output-relay spaces is empty, transferring the wafer carrier to the empty first output-relay space; determining whether the output space is empty; and if the output space is empty, transferring the wafer carrier from the first output-relay space storing the wafer carrier to the output space.

According to some embodiments, a method for dispatching a wafer carrier. The method includes: providing a stocker, wherein the stocker has an input space, a plurality of first input-relay spaces, and a plurality of storage spaces; determining whether a storage command defining a high priority of a wafer carrier stored in the input space is received; if the storage command is received, determining whether one of the first input-relay spaces is empty; if one of the first input-relay spaces is empty, transferring the wafer carrier to the empty first input-relay space; determining whether one of the storage spaces is empty; and if one of the storage spaces is empty, transferring the wafer carrier from the first input-relay space storing the wafer carrier to the empty storage space.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stocker, comprising:
    a storage shelf having a plurality of storage spaces;
    an output-relay shelf having a plurality of first output-relay spaces;
    a first crane;
    an output shelf having an output space;
    a second crane; and
    a controller configured to drive the first crane to transfer a first wafer carrier stored in one of the storage spaces to an empty one of the first output-relay spaces according to a delivery command if there is a high delivery priority of the first wafer carrier, and configured to drive the second crane to transfer the first wafer carrier from the first output-relay space storing the first wafer carrier to the output space according to the delivery command if the output space is empty.

2. The stocker of claim 1, wherein the output shelf further has a plurality of second output-relay spaces, and the controller is further configured to drive the second crane to temporarily transfer the first wafer carrier from the first output-relay space storing the first wafer carrier to an empty one of the second output-relay spaces according to the delivery command if the output space is not empty.

3. The stocker of claim 2, wherein when the output space is empty after the first wafer carrier is transferred to the empty second output-relay space, the controller is further configured to drive the second crane to transfer the first wafer carrier from the second output-relay space storing the first wafer carrier to the output space according to the delivery command.

4. The stocker of claim 1, further comprising:
    an input-relay shelf having a plurality of first input-relay spaces;
    an input shelf having an input space; and
    a third crane,
    wherein the controller is further configured to drive the third crane to transfer a second wafer carrier stored in the input space to an empty one of the first input-relay spaces according to a storage command defining a high storage priority of the second wafer carrier, and configured to drive the first crane to transfer the second wafer carrier from the first input-relay space storing the second wafer carrier to an empty one of the storage spaces according to the storage command.

5. The stocker of claim 4, wherein the input shelf further has a plurality of second input-relay spaces, and the controller is further configured to drive the third crane to temporarily transfer the second wafer carrier from the input space to an empty one of the second input-relay spaces according to the storage command if all of the first input-relay spaces are not empty.

6. The stocker of claim 5, wherein when one of the first input-relay spaces is empty after the second wafer carrier is transferred to the empty second input-relay space, the controller is further configured to drive the third crane to transfer the second wafer carrier from the second input-relay space storing the second wafer carrier to the empty first input-relay space according to the storage command.

7. A method for dispatching a wafer carrier, the method comprising:
    providing a stocker, wherein the stocker has a plurality of storage spaces, a plurality of first output-relay spaces, and an output space;
    determining whether a delivery command defining a high delivery priority of a wafer carrier stored in one of the storage spaces is received;
    if the delivery command is received, determining whether one of the first output-relay spaces is empty;
    if one of the first output-relay spaces is empty, transferring the wafer carrier to the empty first output-relay space;
    determining whether the output space is empty; and
    if the output space is empty, transferring the wafer carrier from the first output-relay space storing the wafer carrier to the output space.

8. The method of claim 7, further comprising:
    if the delivery command is not received, determining whether the delivery command is received again after a predetermined time interval.

9. The method of claim 7, further comprising:
    if all of the first output-relay spaces are not empty, determining whether one of the first output-relay spaces is empty again after a predetermined time interval.

10. The method of claim 7, wherein the stocker further includes a plurality of second output-relay spaces, and the method further comprises:
    if the output space is not empty, determining whether one of the second output-relay spaces is empty; and
    if one of the second output-relay spaces is empty, temporarily transferring the wafer carrier from the first output-relay space storing the wafer carrier to the empty second output-relay space.

11. The method of claim 10, further comprising:
    if all of the second output-relay spaces are not empty, determining whether one of the second output-relay spaces is empty again after a predetermined time interval.

12. The method of claim 10, further comprising:
    after the wafer carrier is transferred to the empty second output-relay space, determining whether the output space is empty again after a predetermined time interval; and
    if the output space is empty after the wafer carrier is transferred to the empty second output-relay space, transferring the wafer carrier from the second output-relay space storing the wafer carrier to the output space.

13. The method of claim 12, further comprising:
    if the output space is not empty after the wafer carrier is transferred to the empty second output-relay space, determining whether the output space is empty again after a predetermined time interval.

14. A method for dispatching a wafer carrier, the method comprising:
providing a stocker, wherein the stocker has an input space, a plurality of first input-relay spaces, and a plurality of storage spaces;
determining whether a storage command defining a high storage priority of a wafer carrier stored in the input space is received;
if the storage command is received, determining whether one of the first input-relay spaces is empty;
if one of the first input-relay spaces is empty, transferring the wafer carrier to the empty first input-relay space;
determining whether one of the storage spaces is empty; and
if one of the storage spaces is empty, transferring the wafer carrier from the first input-relay space storing the wafer carrier to the empty storage space.

15. The method of claim 14, further comprising:
if the storage command is not received, determining whether the storage command is received again after a predetermined time interval.

16. The method of claim 14, further comprising:
if all of the storage spaces are not empty, determining whether one of the storage spaces is empty again after a predetermined time interval.

17. The method of claim 14, wherein the stocker further includes a plurality of second input-relay spaces, and the method further comprises:
if all of the first input-relay spaces are not empty, determining whether one of the second input-relay spaces is empty; and
if one of the second input-relay spaces is empty, temporarily transferring the wafer carrier from the input space storing the wafer carrier to the empty second input-relay space.

18. The method of claim 17, further comprising:
if all of the second input-relay spaces are not empty, determining whether one of the second input-relay spaces is empty again after a predetermined time interval.

19. The method of claim 17, further comprising:
after the wafer carrier is transferred to the empty second input-relay space, determining whether one of the first input-relay spaces is empty again after a predetermined time interval; and
if one of the first input-relay spaces is empty after the wafer carrier is transferred to the empty second input-relay space, transferring the wafer carrier from the second input-relay space storing the wafer carrier to the empty first input-relay space.

20. The method of claim 19, further comprising:
if all of the first input-relay spaces are not empty after the wafer carrier is transferred to the empty second input-relay space, determining whether one of the first input-relay spaces is empty again after a predetermined time interval.

* * * * *